United States Patent
Jo et al.

(10) Patent No.: US 11,079,885 B2
(45) Date of Patent: Aug. 3, 2021

(54) DISPLAY DEVICE HAVING TOUCH SENSOR

(71) Applicant: LG Display Co., Ltd., Seoul (KR)

(72) Inventors: Eun-Min Jo, Seoul (KR); Sung-Wook Chang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/715,714

(22) Filed: Dec. 16, 2019

(65) Prior Publication Data
US 2020/0363905 A1    Nov. 19, 2020

(30) Foreign Application Priority Data

May 14, 2019    (KR) .................. 10-2019-0056608

(51) Int. Cl.
| | |
|---|---|
| *G06F 3/045* | (2006.01) |
| *G06F 3/044* | (2006.01) |
| *H01L 27/32* | (2006.01) |
| *H01L 51/52* | (2006.01) |
| *H01L 51/00* | (2006.01) |

(52) U.S. Cl.
CPC .......... *G06F 3/0443* (2019.05); *H01L 27/322* (2013.01); *H01L 27/323* (2013.01); *H01L 27/3246* (2013.01); *H01L 27/3276* (2013.01); *H01L 51/0097* (2013.01); *H01L 51/5253* (2013.01); *H01L 51/5284* (2013.01); *G06F 2203/04102* (2013.01); *G06F 2203/04112* (2013.01); *H01L 2251/5338* (2013.01)

(58) Field of Classification Search
CPC . G06F 2203/04102; G06F 2203/04112; G06F 3/0443; H01L 2251/5338; H01L 27/322; H01L 27/323; H01L 27/3246; H01L 27/3276; H01L 51/0097; H01L 51/5253; H01L 51/5284
See application file for complete search history.

(56) References Cited

U.S. PATENT DOCUMENTS

| | | | |
|---|---|---|---|
| 10,409,433 B2 | 9/2019 | Kwak et al. | |
| 10,541,281 B2 | 1/2020 | Han et al. | |
| 10,754,461 B2 | 8/2020 | Pak et al. | |

(Continued)

FOREIGN PATENT DOCUMENTS

| | | |
|---|---|---|
| CN | 204288192 U | 4/2015 |
| CN | 104898913 B | 5/2018 |

(Continued)

OTHER PUBLICATIONS

The Intellectual Property Office of the United Kingdom, Office Action, GB Patent Application No. 1918610.5, dated May 26, 2020, six pages.

(Continued)

*Primary Examiner* — Insa Sadio
(74) *Attorney, Agent, or Firm* — Fenwick & West LLP

(57) ABSTRACT

The present disclosure provides a display device having a touch sensor for reducing the size of a bezel area. The display device having a touch sensor is configured such that touch electrodes and touch lines are disposed in a mesh shape on an encapsulation layer encapsulating light-emitting elements and such that some of the touch lines are connected to a touch-driving circuit via an upper bezel area, thereby reducing the size of left and right bezel areas.

31 Claims, 17 Drawing Sheets

(56) References Cited

U.S. PATENT DOCUMENTS

| | | |
|---|---|---|
| 2013/0342226 A1 | 12/2013 | Wang et al. |
| 2015/0070794 A1 | 3/2015 | Wu et al. |
| 2017/0153762 A1 | 6/2017 | Kim et al. |
| 2017/0220159 A1 | 8/2017 | Xu |
| 2018/0031880 A1 | 2/2018 | Kwak et al. |
| 2018/0039358 A1 | 2/2018 | Xie et al. |
| 2018/0095566 A1* | 4/2018 | Lee .................. G06F 3/047 |
| 2018/0190723 A1 | 7/2018 | Han et al. |
| 2018/0348937 A1 | 12/2018 | Pak et al. |
| 2019/0097171 A1* | 3/2019 | Park .................. H01L 51/0097 |
| 2019/0369778 A1 | 12/2019 | Kwak et al. |

FOREIGN PATENT DOCUMENTS

| | | |
|---|---|---|
| CN | 108984014 A | 12/2018 |
| CN | 109656410 A | 4/2019 |
| TW | 201807472 A | 3/2018 |
| TW | 201839574 A | 11/2018 |

OTHER PUBLICATIONS

Taiwan Intellectual Property Office, Office Action, TW Patent Application No. 108146966, dated Jul. 15, 2020, 11 pages.
Intellectual Property Office of the United Kingdom, Office Action, GB Patent Application No. 1918610.5, dated Nov. 26, 2020, five pages.

* cited by examiner

DISPLAY DEVICE HAVING TOUCH SENSOR

CROSS-REFERENCE TO RELATED APPLICATION

This application claims the benefit of Republic of Korea Patent Application No. 10-2019-0056608, filed on May 14, 2019, which is hereby incorporated by reference in its entirety.

BACKGROUND OF THE DISCLOSURE

Field of the Disclosure

The present disclosure relates to a display device, and more particularly to a display device having a touch sensor for reducing the size of a bezel area.

Discussion of the Related Art

A touch sensor is an input device through which a user may input a command by selecting instructions displayed on a screen of a display device using a hand or an object. That is, the touch sensor converts a contact position that directly contacts a human hand or an object into an electrical signal and receives selected instructions based on the contact position as an input signal. Such a touch sensor may substitute for a separate input device that is connected to a display device and operated, such as a keyboard or a mouse, and thus the range of application of the touch sensor has continually increased.

When a touch sensor is disposed on a display device, the number of touch lines connecting touch electrodes to a touch driving IC increases as the number of touch electrodes increases. As a result, the size of a non-display area in which the touch lines are disposed, i.e., a bezel area, increases.

SUMMARY

Accordingly, the present disclosure is directed to a display device having a touch sensor that substantially obviates one or more problems due to limitations and disadvantages of the related art.

An object of the present disclosure is to provide a display device having a touch sensor for reducing the size of a bezel area and/or for reducing the thickness of the display panel.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device having a touch sensor is configured such that touch electrodes and touch lines are disposed in a mesh shape on an encapsulation layer encapsulating light-emitting elements and such that some of the touch lines are connected to a touch-driving circuit via an upper bezel area, thereby reducing the size of left and right bezel areas.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to exemplary embodiments of the present disclosure, examples of which are illustrated in the accompanying drawings. Wherever possible, the same reference numbers will be used throughout the drawings to refer to the same or like parts.

Figure 1:
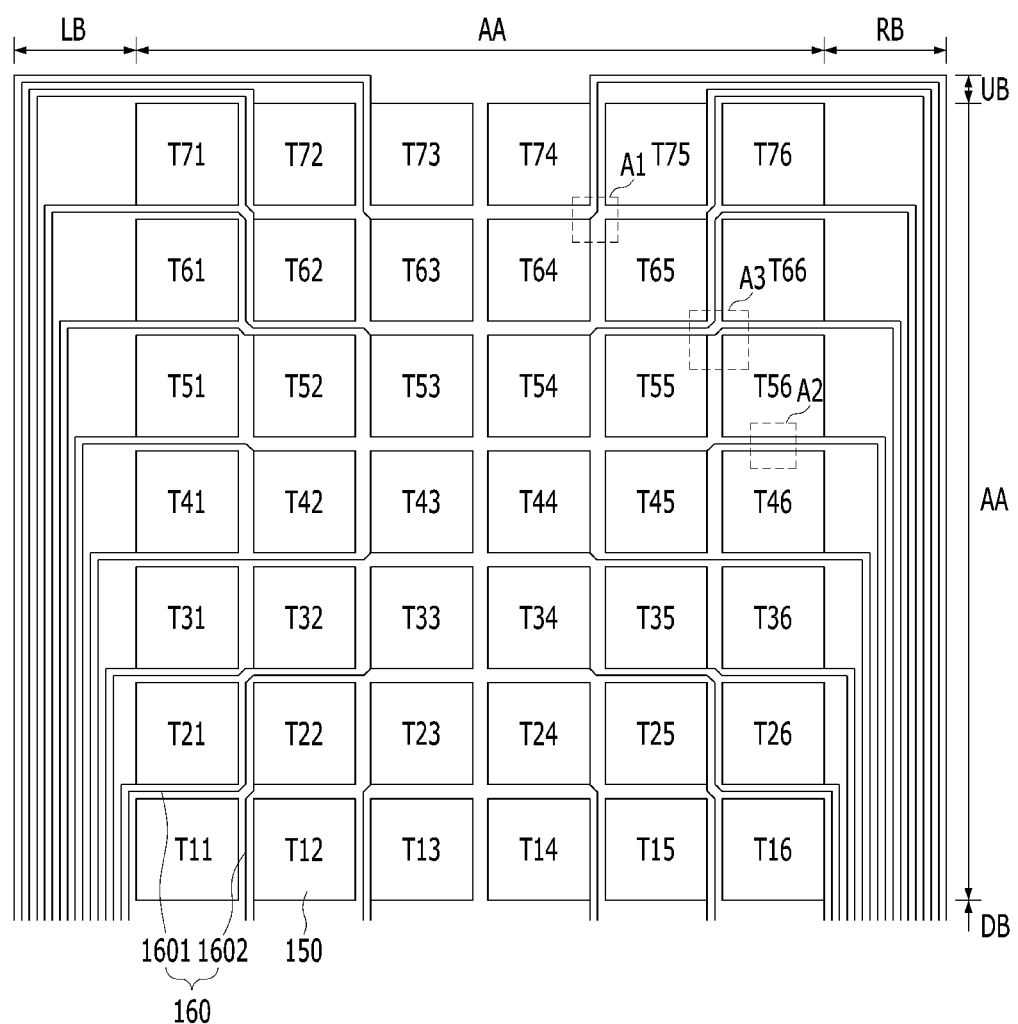
FIG. 1 is a plan view showing a touch display device according to an embodiment of the present disclosure.
Figure 2:
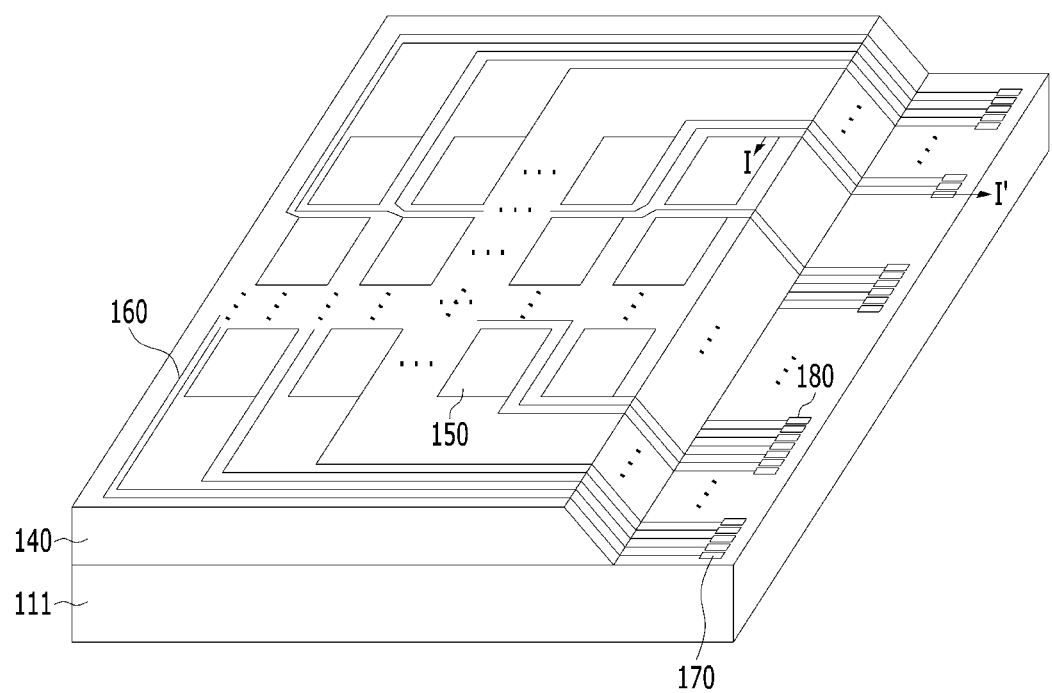
FIG. 2 is a perspective view showing the touch display device shown in FIG. 1 according to an embodiment of the present disclosure.
Figure 3A:
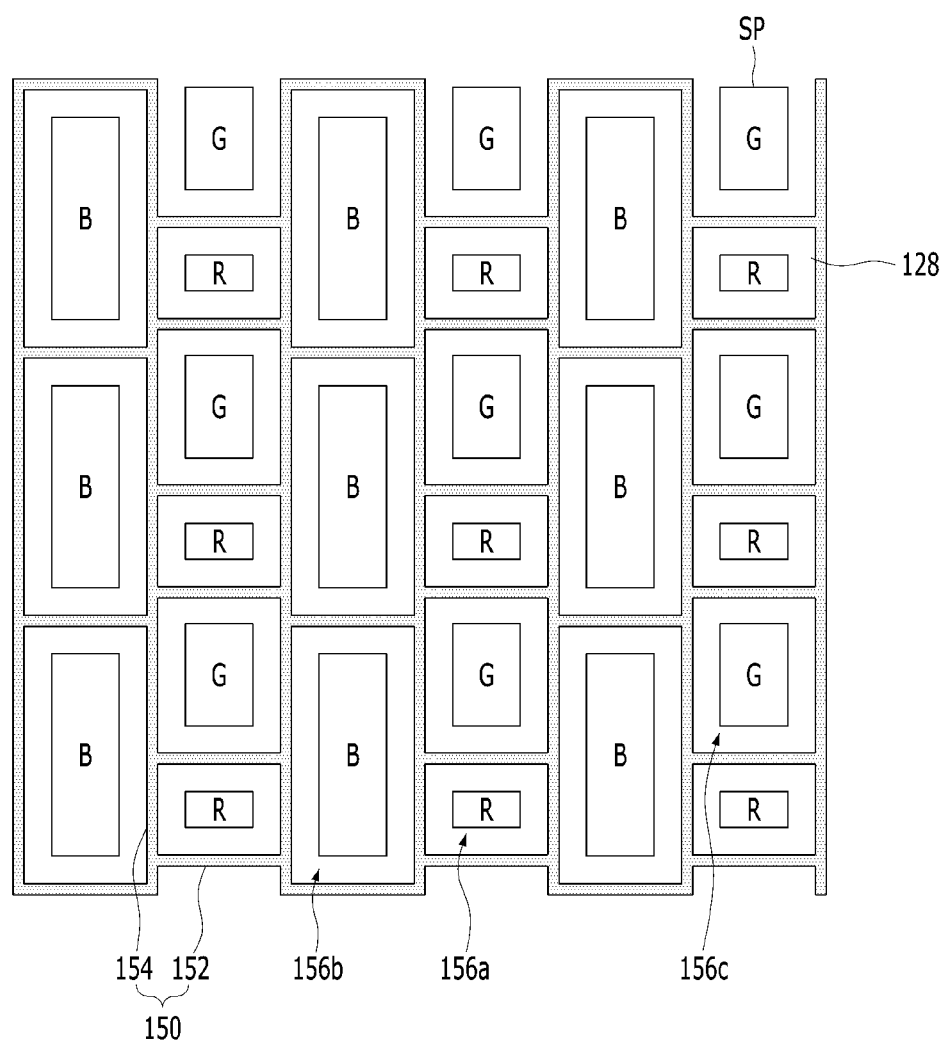
FIG. 3A is a plan view showing the touch electrodes shown in FIG. 1 in detail according to an embodiment of the present disclosure.
Figure 3B:
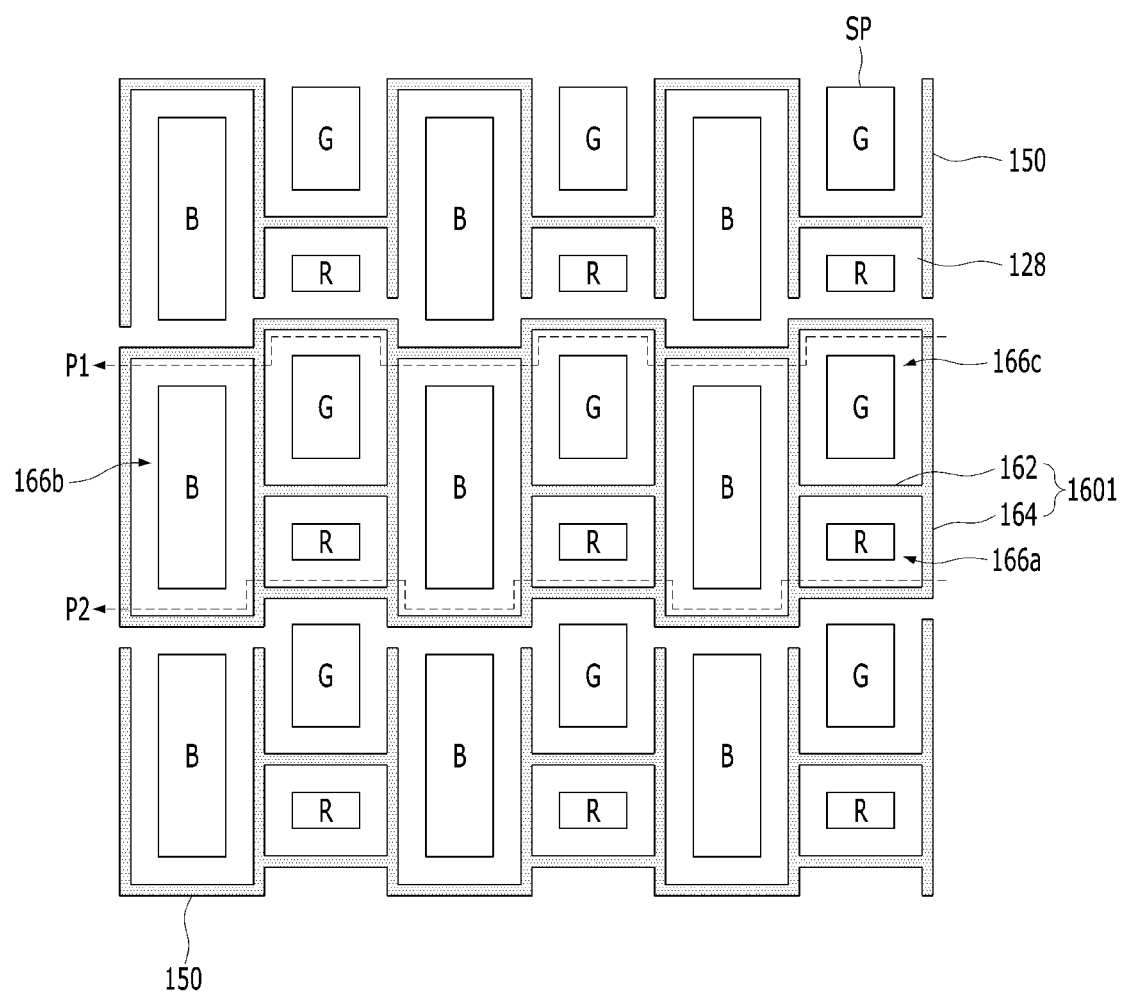
FIG. 3B is a plan view showing the touch lines shown in FIG. 1 in detail according to an embodiment of the present disclosure.
Figure 4A:
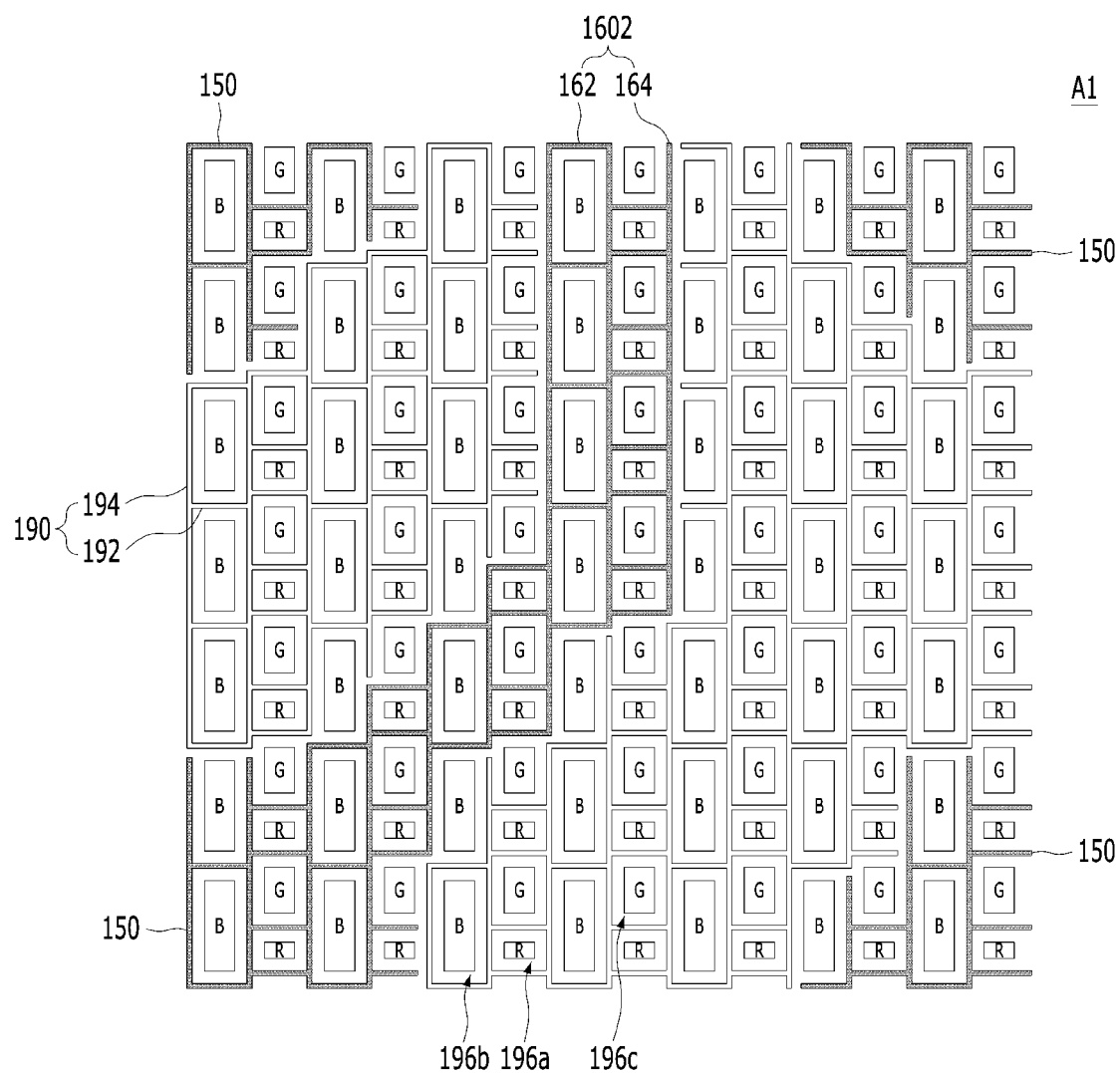
FIG. 4A is a plan view showing the first area A1 shown in FIG. 1 in detail according to an embodiment of the present disclosure.
Figure 4B:
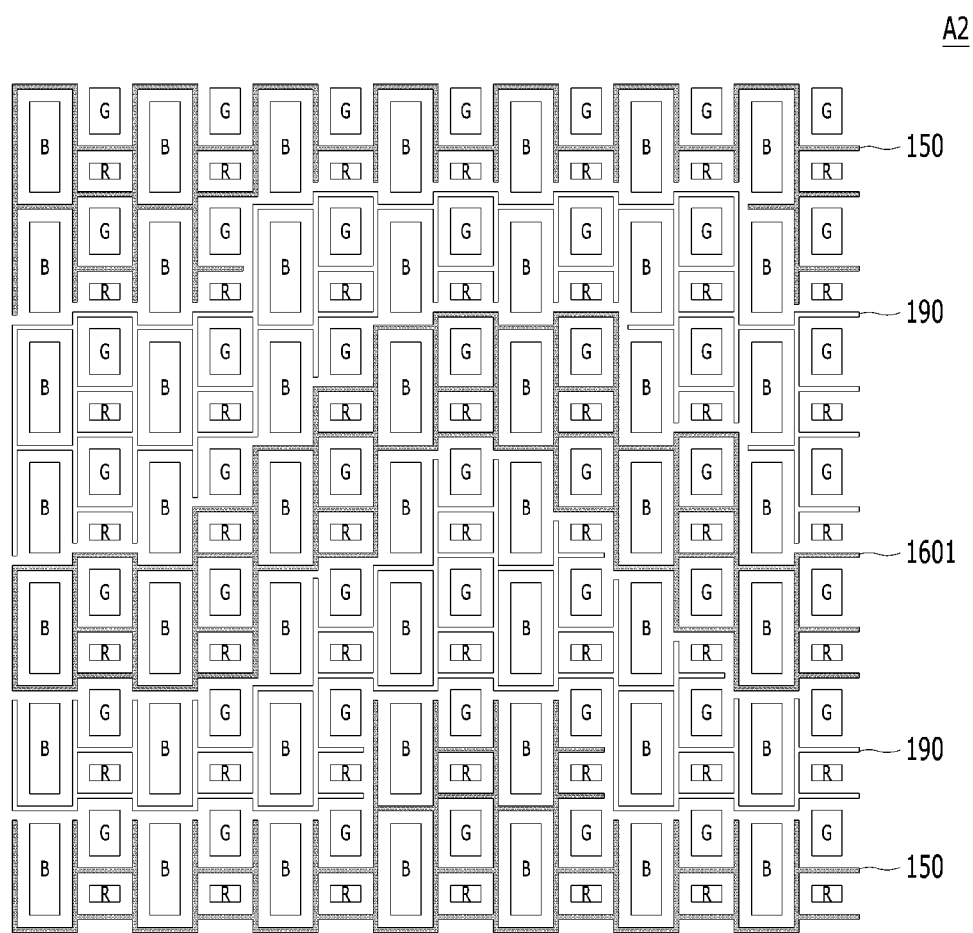
FIG. 4B is a plan view showing the second area A2 shown in FIG. 1 in detail according to an embodiment of the present disclosure.
Figure 4C:
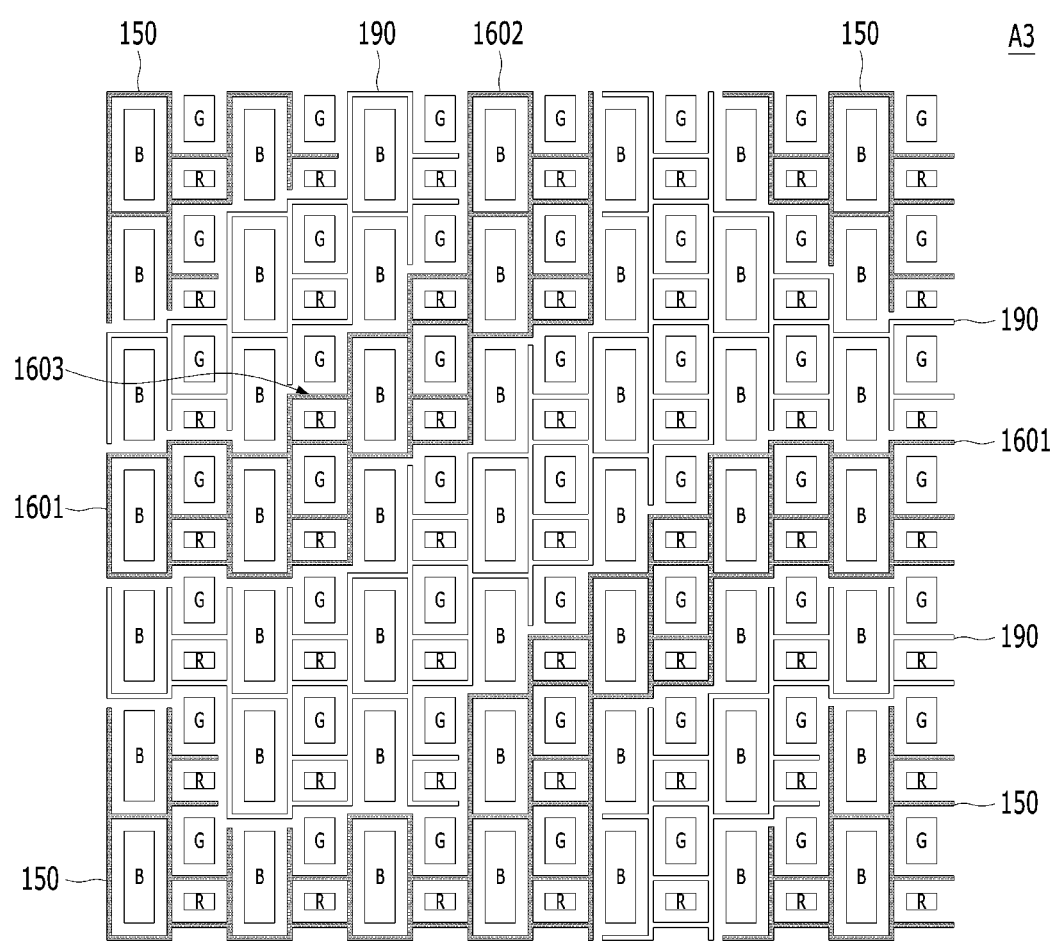
FIG. 4C is a plan view showing the third area A3 shown in FIG. 1 in detail according to an embodiment of the present disclosure.

FIG. 1 is a plan view showing a touch display device according to an embodiment of the present disclosure. FIG. 2 is a perspective view showing the touch display device shown in FIG. 1. FIG. 3A is a plan view showing the touch electrodes shown in FIG. 1 in detail, and FIG. 3B is a plan view showing the touch lines shown in FIG. 1 in detail. FIG. 4A is a plan view showing the first area A1 shown in FIG. 1 in detail, FIG. 4B is a plan view showing the second area A2 shown in FIG. 1 in detail, and FIG. 4C is a plan view showing the third area A3 shown in FIG. 1 in detail.

The touch display device shown in FIG. 1 includes a plurality of touch electrodes 150 and touch lines 160 connected to respective touch electrodes 150.

Each of the touch electrodes 150 includes a capacitance formed therein, and thus is used as a self-capacitance-type touch sensor that senses variation in capacitance due to a user touch. In a self-capacitance sensing method using such touch electrodes 150, when a driving signal supplied through the touch line 160 is applied to the touch electrode 150, an electric charge Q accumulates in the touch sensor. At this time, when a user's finger or a conductive object touches the touch electrode 150, parasitic capacitance is additionally connected to the self-capacitance sensor, and thus a capacitance value varies. Therefore, it is possible to determine the presence or absence of a touch based on the difference in capacitance values between a touch sensor that is touched and a touch sensor that is not touched.

The touch electrodes 150 are divided from each other in first and second directions intersecting each other, and are independently formed on an encapsulation layer 140. Each of the touch electrodes 150 is formed in a region corresponding to a plurality of subpixels in consideration of a touch area of a user. For example, one touch electrode 150 is formed in a region that is from several times to several hundred times larger than the size of one subpixel.

The touch electrodes 150 are formed so as to be the same size as each other. Accordingly, variation in touch sensitivity between the touch electrodes 150 is minimized, thus reducing noise.

Not more than one of the touch lines 160 is disposed between each two touch electrodes of the touch electrodes 150. The touch lines 160 are connected to the touch electrodes 150 in an active area AA, and are connected to a touch-driving circuit (not shown) disposed in a lower bezel area DB.

Here, at least one of the touch lines 160 is connected to the touch-driving circuit via an upper bezel area UB as well as a left bezel area LB and a right bezel area RB. As a result, according to the present disclosure, it is possible to realize a narrow bezel by reducing the sizes of the left bezel area LB and the right bezel area RB.

For example, in a comparative example in which six touch electrodes are disposed in a horizontal direction and seven touch electrodes are disposed in a vertical direction, touch lines are disposed so as to extend only in the horizontal direction in an active area. In this case, the touch lines respectively connected to the six touch electrodes disposed in the first row are connected to a touch-driving circuit via a lower bezel, and the touch lines respectively connected to the remaining thirty-six touch electrodes are connected to the touch-driving circuit in a manner such that eighteen touch lines are connected to the touch-driving circuit via a left bezel and the remaining eighteen touch lines are connected to the touch-driving circuit via a right bezel.

On the other hand, in the embodiment of the present disclosure in which six touch electrodes are disposed in a horizontal direction and seven touch electrodes are disposed in a vertical direction, as shown in FIG. 1, each of the touch lines 160 is formed so as to include at least one of a horizontal extension portion 1601 or a vertical extension portion 1602 disposed between the touch electrodes 150. Specifically, each of the touch lines 160 connected to the touch electrodes T33, T34, T53 and 154, which are disposed in the third and fourth columns of the third and fifth rows located on both sides of the fourth row (the middle row), includes a horizontal extension portion 1601 extending in the horizontal direction and a vertical extension portion 1602 extending in the vertical direction. Each of the touch lines 160 connected to the touch electrodes T22, T23, 124, T25, T62, T63, T64 and T65, which are disposed in the second to fifth columns of the second and sixth rows, includes a vertical extension portion 1602. Each of the touch lines 160 connected to the remaining touch electrodes includes a horizontal extension portion 1601. In each touch line 160 including the vertical extension portion 1602, only one vertical extension portion 1602 is disposed between each two touch electrodes of the touch electrodes.

In this case, six touch lines 160 respectively connected to the six touch electrodes T11 to T16 disposed in the first row and four touch lines 160, each including the vertical extension portion 1602, among the touch lines 160 connected to the touch electrodes T21 to T26 disposed in the second row, are connected to the touch-driving circuit via the lower bezel area DB. The touch lines 160 respectively connected to the remaining thirty-two touch electrodes 150 are connected to the touch-driving circuit in a manner such that sixteen touch lines are connected to the touch-driving circuit via the left bezel area LB and the remaining sixteen touch lines are connected to the touch-driving circuit via the right bezel area RB. Here, the touch lines 160 connected to the touch electrodes T62, T63, T64, T65, T72, T73, T74 and T75, which are disposed in the second to fifth columns of the sixth and seventh rows, are connected to the touch-driving circuit via the upper bezel area UB and the left bezel area LB and the right bezel area RB.

Accordingly, it is possible to reduce the number of touch lines 160 that extend along the left bezel area LB and right bezel area RB, thereby reducing the size of the left bezel area LB and right bezel area RB compared to the comparative example.

Further, since the touch lines 160 of the present disclosure include the vertical extending portions 1602, it is possible to reduce the area in which the horizontal extension portions 1601 of the touch lines 160 are disposed compared to the comparative example. As a result, it is possible to reduce an overlapping area between the touch lines 160 of the present disclosure and scan lines extending in the horizontal direction and consequently to prevent a touch signal transmitted through the touch lines 160 from being changed due to a scan signal supplied to the scan lines.

The touch electrodes 150 and the touch lines 160 of the present disclosure are directly formed on a display panel that generates an image. For example, the touch electrodes 150 and the touch lines 160, as shown in FIG. 2, are directly formed on the encapsulation layer 140, which encapsulates a plurality of light-emitting elements disposed on a substrate 111.

Each of the touch electrodes 150 disposed on the encapsulation layer 140 is formed in a single-layer or multi-layer structure using an opaque metal having high corrosion resistance and acid resistance and excellent conductivity, such as Ta, Ti, Cu, Mo, Al, or alloy thereof, such as Ti—Al—Ti, Mo—Al—Mo, or any other combination thereof, or is formed in a single-layer or multi-layer structure using an ITO, IZO, IGZO, or ZnO-based transparent conductive film and an opaque metal. The touch line 160 and the touch pad 170 may be formed of the same material as the touch electrodes 150. Furthermore, an upper touch pad electrode 174 of the touch pad 170 may be formed of the same material as the touch electrodes 150.

The touch electrode 150 including an opaque metal, as shown in FIG. 3A, is formed in a mesh shape so as not to overlap emission areas of red (R), green (G) and blue (B) subpixels SP but to overlap a bank 128 disposed between the emission areas. For example, the mesh-type touch electrode 150 includes first touch electrode segment 152 and second touch electrode segment 154 connected to each other. The first touch electrode segment 152 is disposed in a first direction, which is a horizontal direction, so as to be parallel to scan lines conductively connected to the light-emitting elements, and the second touch electrode segment 154 is disposed in a second direction, which is a vertical direction, so as to be parallel to data lines conductively connected to the light-emitting elements. The mesh-type touch electrodes 150, which include the first touch electrode segment 152 and second touch electrode segment 154, are formed so as to define a first electrode opening 156a, which exposes the emission area of the red (R) subpixel SP, a second electrode opening 156b, which exposes the emission area of the blue (B) subpixel SP, and a third electrode opening 156c, which exposes the emission area of the green (G) subpixel SP. Here, the first electrode opening 156a, the second electrode opening 156b, the third electrode opening 156c are formed so as to correspond to the emission areas of the respective subpixels SP. The first electrode opening 156a, the second electrode opening 156b, the third electrode opening 156c may be formed to have the same area as each other so as to correspond to the emission areas of the respective subpixels SP, or at least one of them may be formed to have a different area. For example, in the case in which the red (R), green (G) and blue (B) subpixels SP are formed in a PenTile structure, the second electrode opening 156b, which exposes the emission area of the blue (B) subpixel SP, is formed so as to have a larger area than the third electrode opening 156c, which exposes the emission area of the green (G) subpixel SP, and the third electrode opening 156c is formed so as to have a larger area than the first electrode opening 156a, which exposes the emission area of the red (R) subpixel SP.

In this case, the lengths of the first touch electrode segments 152, which define the first electrode opening 156a, the second electrode opening 156b, the third electrode opening 156c may be equal to each other. The length of the second touch electrode segment 154, which defines the second opening 156b, is greater than the length of the second touch electrode segment 154, which defines the third electrode opening 156c. The length of the second touch electrode segment 154, which defines the third opening 156c, is greater than the length of the second touch electrode segment 154, which defines the first electrode opening 156a.

Since the mesh-type touch electrodes 150 are more conductive than a transparent conductive film, the touch electrodes 150 may be configured as low-resistance electrodes. Thereby, the resistance and capacitance of the touch electrodes 150 may be reduced, and the RC time constant may be reduced, which may result in increased touch sensitivity.

Further, the first touch electrode segment 152 and second touch electrode segment 154 forming the mesh-shaped touch electrodes 150 overlap the bank 128, with a smaller line width than the bank 128, thereby preventing the aperture ratio and transmittance from being lowered by the touch electrodes 150.

As shown in FIG. 2, the touch lines 160 connected to the touch electrodes 150 extend along the side surface of the encapsulation layer 140 and are connected to the touch pads 170 in the lower bezel area. The touch lines 160 are connected to the touch pads 170, which are disposed on the substrate 111 or the insulation film exposed by the encapsulation layer 140. Display pads 180 may be disposed between the touch pads 170, or the touch pads 170 may be disposed between the display pads 180. The touch pads 170 are formed in the same stacking structure in the same plane as the display pads 180, which are connected to at least one of the scan lines or the data lines of the pixel-driving circuit. In this case, the top surfaces of the touch pads 170 and the top surfaces of the display pads 180 are located at the same height, and thus the contact force between the pads 170 and 180 and signal transmission films (not shown), which are connected to the touch pads 170 and the display pads 180, increases.

In the active area AA, as shown in FIG. 3B, each of the horizontal extension portions 1601 and the vertical extension portions 1602, which are included in the touch lines 160, are formed in a mesh shape so as not to overlap the emission areas of the red (R), green (G) and blue (B) subpixels SP but to overlap the bank 128. For example, each of the horizontal extension portion 1601 and vertical extension portion 1602 includes first touch line segment 162 and second touch line segment 164, which are connected to each other. The first touch line segment 162 is disposed in a first direction, which is a horizontal direction, so as to be parallel to the first touch electrode segment 152 and the scan lines conductively connected to the light-emitting elements, and the second touch line segment 164 is disposed in a second direction, which is a vertical direction, so as to be parallel to the second touch electrode segment 154 and the data lines conductively connected to the light-emitting elements. The mesh-type touch lines 160 are formed so as to define a first line opening 166a, a second line opening 166b, and a third line opening 166c, which are surrounded by the first touch line segment 162 and second touch line segment 164. The first line opening 166a exposes the emission area of the red (R) subpixel SP disposed between the touch electrodes 150, the second line opening 166b exposes the emission area of the blue (B) subpixel SP disposed between the touch electrodes 150, and the third line opening 166c exposes the emission area of the green (G) subpixel SP disposed between the touch electrodes 150. Here, the first line opening 166a, the second line opening 166b, and the third line opening 166c are formed so as to correspond to the emission areas of the respective subpixels SP. For example, the first line opening 166a, the second line opening 166b, and the third line opening 166c are formed so as to correspond to the emission areas of the subpixels SP disposed between the touch electrodes 150, and thus have the same size and the same shape as the first electrode opening 156a, the second electrode opening 156b, and the third electrode opening 156c.

As shown in FIG. 3B, each of the horizontal extension portion 1601 and vertical extension portion 1602, which are included in the mesh-type touch lines, is formed so as to have a first path P1 and a second path P2. Thereby, even when any one of the multiple paths of the touch lines 160 is disconnected, transmission of a touch signal is enabled through the remaining path.

For example, as shown in FIG. 4A, the vertical extension portion 1602, which is included in the touch lines 160, is formed so as to have at least the first path P1 and the second path P2 in a manner such that the first touch line segment 162 and second touch line segment 164 surrounding the blue (B) subpixels SP disposed in a line are connected to the first touch line segment 162 and second touch line segment 164 surrounding the red (R) and green (G) subpixels SP, which are adjacent to the blue (B) subpixels SP.

As shown in FIG. 4B, the horizontal extension portion 1601, which is included in the touch lines 160, is formed so as to have at least the first path P1 and the second path P2 in a manner such that the first touch line segments 162 disposed between the blue (B) subpixels SP are connected to the first touch line segments 162 disposed between the red (R) subpixels SP and the green (G) subpixels SP via the second touch line segments 164. In this case, a part of the horizontal extension portion 1601 is formed in a zigzag shape, and the other part of the horizontal extension portion 1601 is formed in a stepped shape.

As shown in FIG. 4c, the vertical extension portion 1602 and the horizontal extension portion 1601, which are included in the touch lines 160, are connected to each other via a connection extension portion 1603. At least a part of the connection extension portion 1603 is formed in a stepped shape. The first touch line segments 162 of the vertical extension portion 1602 disposed between the blue (B) subpixels SP and the first touch line segments 162 of the vertical extension portion 1602 disposed between the red (R) subpixels SP and the green (G) subpixels SP are connected to each other via the second touch line segments 164, thereby forming a stepped shape.

The touch electrodes 150, which face the touch lines 160 formed in a zigzag shape and a stepped shape, are also formed in a zigzag shape and a stepped shape, as shown in FIGS. 4A to 4C.

As shown in FIGS. 4A to 4C, a dummy pattern 190 is formed between the touch electrodes 150 and the touch lines 160, between the touch electrodes 150, and between the touch lines 160. The dummy pattern 190 is formed in a mesh shape so as not to overlap the emission areas of the red (R), green (G) and blue (B) subpixels SP but to overlap the bank 128 in the active region AA. The dummy pattern 190 includes first dummy pattern segment 192 and second dummy pattern segment 194 connected to each other. The first dummy pattern segment 192 is disposed parallel to the scan lines, the first touch electrode segment 152, and the first touch line segment 162. The second dummy pattern segment 194 is disposed parallel to the data lines, the second touch electrode segment 154, and the second touch line segment 164. The mesh-type dummy pattern 190 is formed so as to define a first dummy opening 196a, a second dummy opening 196b, and a third dummy opening 196c that expose the emission areas of the respective subpixels. The first dummy opening 196a exposes the emission area of the red (R) subpixel SP, the second dummy opening 196b exposes the emission area of the blue (B) subpixel SP, and the third dummy opening 196c exposes the emission area of the green (G) subpixel SP.

Since the dummy pattern 190 faces the touch line 160, which is formed in a zigzag shape and/or a stepped shape, a part of the dummy pattern 190 has a zigzag shape and a stepped shape.

Thus, the dummy pattern 190 is formed in a mesh shape together with the touch electrode 150 and the touch line 160, thereby preventing the boundary between the touch electrode 150 and the touch line 160 from being visible.

The dummy pattern 190 is put into a floating state in which a driving signal or a voltage is not applied thereto from the outside. Accordingly, the dummy pattern 190 may reduce the parasitic capacitance between the touch electrode 150 and the touch line 160, the parasitic capacitance between the touch electrodes 150, and the parasitic capacitance between the touch lines 160, thereby improving touch sensitivity.

Further, the dummy pattern 190 is disposed in the same plane as the touch electrode 150 and the touch line 160, which are formed of the same material as the dummy pattern 190, so as to be spaced apart from the touch electrode 150 and the touch line 160. Thereby, it is possible to prevent a short circuit between the touch electrode 150 and the touch line 160, a short circuit between the touch electrodes 150, and a short circuit between the touch lines 160 due to conductive foreign substances.

Figure 5:
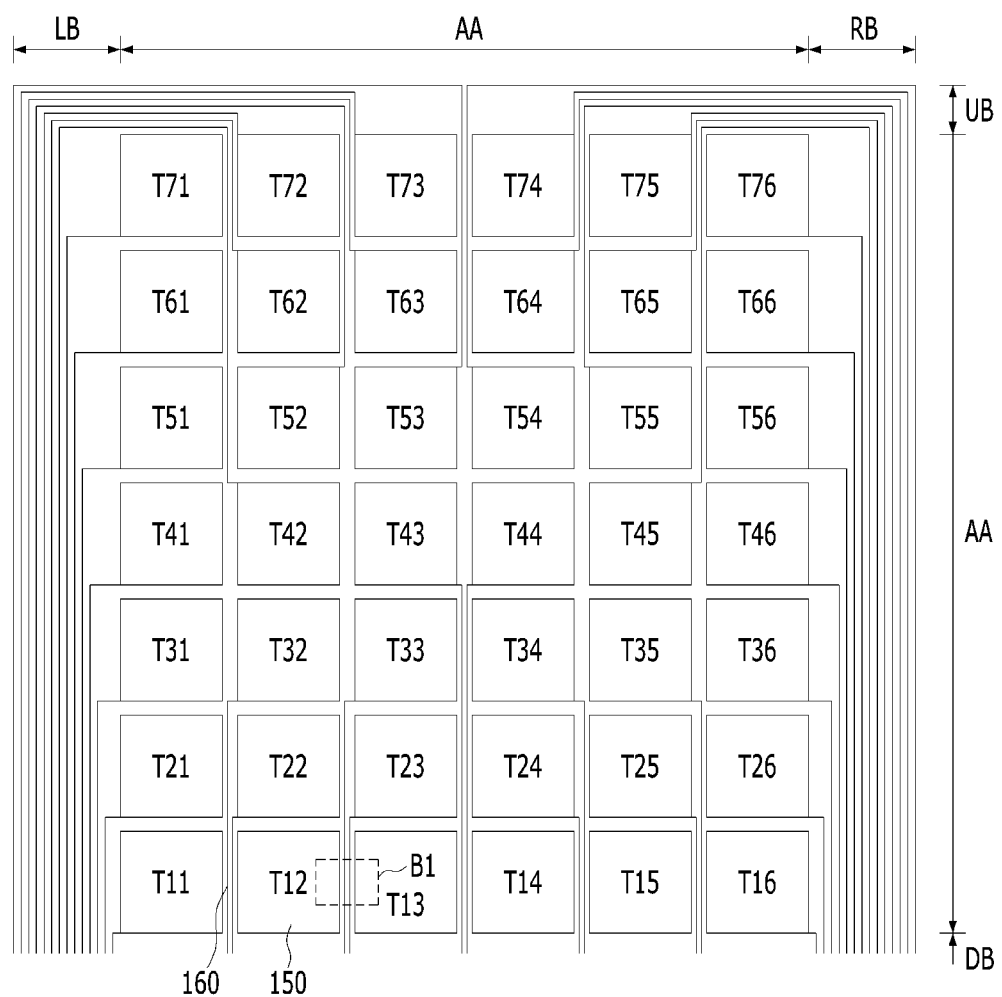
FIG. 5 is a plan view showing a touch display device according to another embodiment of the present disclosure.

FIG. 5 is a plan view showing a touch display device according to another embodiment of the present disclosure. FIGS. 6A to 6E are plan views showing examples of the first area B1 shown in FIG. 5 according to various embodiments of the present disclosure.

The touch display device shown in FIG. 5 has the same configuration as the touch display device shown in FIG. 1, except that the touch lines 160 extend only in the direction in which the touch lines 160 intersect the upper and lower bezel areas UB and DB. Thus, a detailed description of the same constituent elements will be omitted.

Not more than two of the touch lines 160 are disposed between each two touch electrodes of the touch electrodes 150 shown in FIG. 5. At least one of the touch lines 160 is connected to the touch-driving circuit via the upper bezel area UB as well as the left bezel area LB and right bezel area RB. As a result, according to the present disclosure, it is possible to realize a narrow bezel by reducing the sizes of the left bezel area LB and right bezel area RB.

For example, the embodiment of the present disclosure shown in FIG. 5, in which six touch electrodes are disposed in the horizontal direction and seven touch electrodes are disposed in the vertical direction, includes touch lines 160 extending in the vertical direction. Specifically, the touch lines 160 connected to the touch electrodes, other than the touch electrodes T11 to T16, T11 to T71, and T16 to T76 disposed in the first row, the first column and the last (sixth) column, extend in the vertical direction between the touch electrodes 150. Here, not more than two of the touch lines 160 are disposed between each two touch electrodes of the touch electrodes 150.

In this case, six touch lines 160 respectively connected to the six touch electrodes T11 to T16 disposed in the first row, eight touch lines 160 respectively connected to the touch electrodes disposed in the second to fifth columns of the second and third rows, and two touch lines 160 respectively connected to the touch electrodes disposed in the third and fourth columns of the fourth row are connected to the touch pads 170 via the lower bezel area DB. The touch lines 160 respectively connected to the remaining twenty-six touch electrodes 150 are connected to the touch pads 170 in a manner such that thirteen touch lines are connected to the touch pads via the left bezel area LB and the remaining thirteen touch lines are connected to the touch pads via the right bezel area RB. Here, the touch lines 160 connected to the touch electrodes T52, T53, T54, T55, T62, T63, T64, T65, T72, T73, T74 and T75 disposed in the second to fifth columns of the fifth to seventh rows and the touch lines 160 connected to the touch electrodes T42 and T45 disposed in the second and fifth columns of the fourth row are connected to the touch pads 170 via the upper bezel area UB and the left bezel area LB and right bezel area RB.

Accordingly, it is possible to reduce the number of touch lines 160 that extend along the left bezel area LB and right bezel area RB, thereby reducing the size of the left bezel area LB and right bezel area RB compared to the comparative example.

Further, since the touch lines 160 of the present disclosure extend only in the vertical direction in the active area AA, it is possible to minimize an overlapping area between the scan lines extending in the horizontal direction and the touch lines. As a result, it is possible to prevent a touch signal transmitted through the touch lines 160 from being changed due to a scan signal supplied to the scan lines.

Each of the touch lines 160, the touch electrodes 150, and the dummy pattern 190 of the present disclosure is formed in a mesh shape so as not to overlap the emission areas of the red (R), green (G) and blue (B) subpixels SP but to overlap the bank 128 disposed between the emission areas. Further, at least one of the touch lines 160, the touch electrodes 150, or the dummy pattern 190, as shown in FIGS. 6A to 6D, includes branch portions 158, 168 or 198.

Figure 6A:
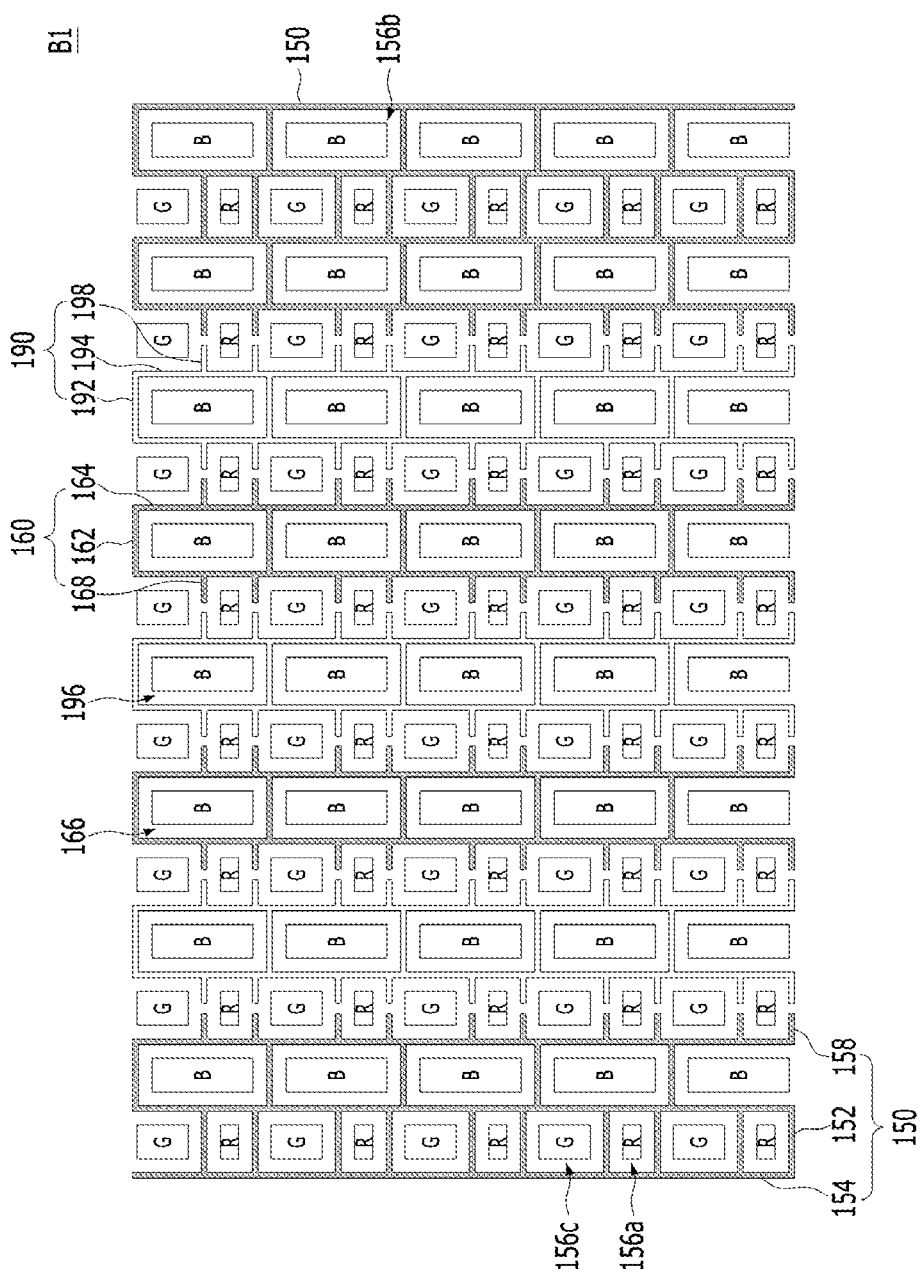
FIGS. 6A to 6E are plan views showing examples of the first area B1 shown in FIG. 5 in detail according to an embodiment of the present disclosure.
Figure 6B:
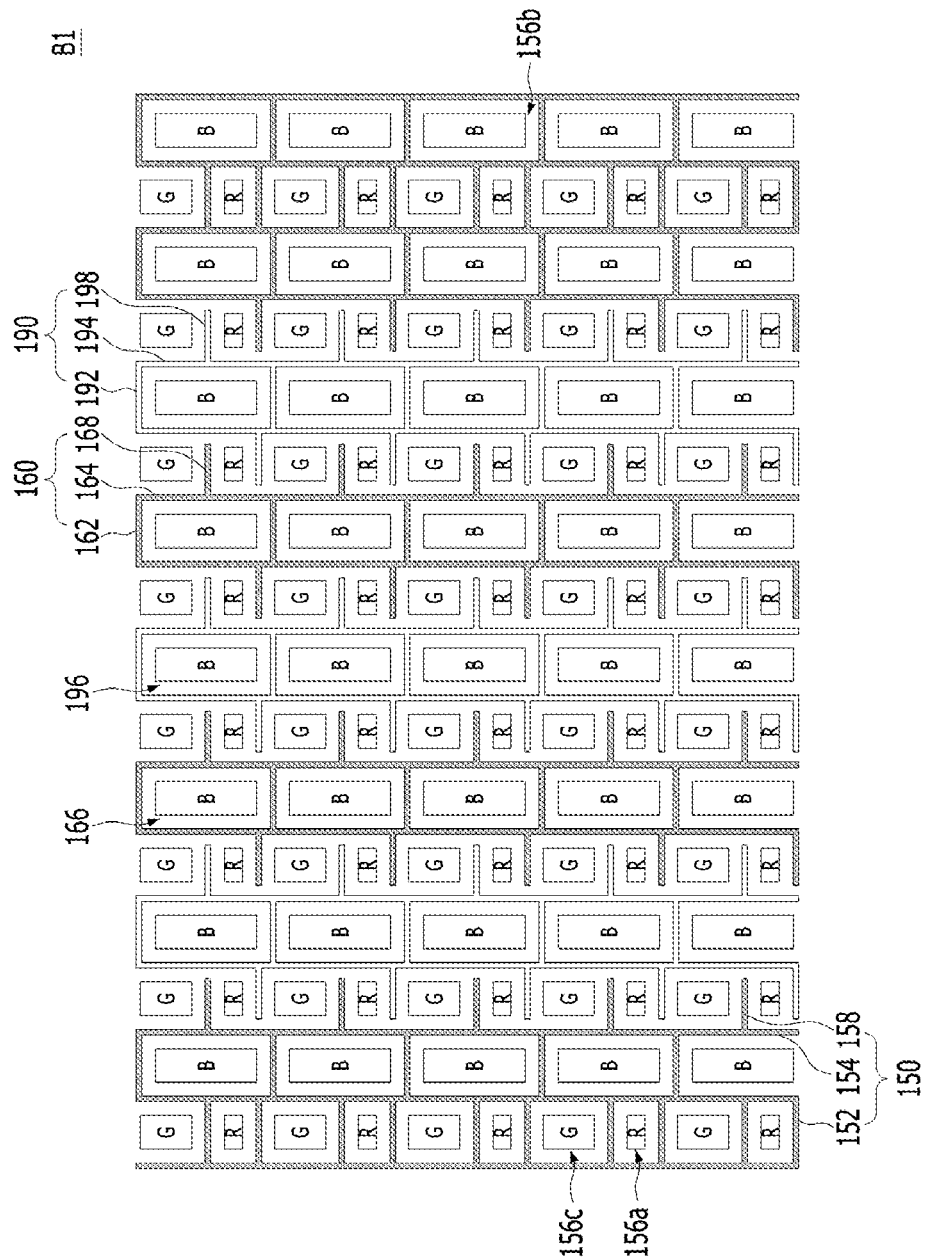

For example, referring to FIGS. 6A and 6B, each of the touch lines 160, the touch electrodes 150, and the dummy pattern 190 includes branch portions 158, 168 and 198. The touch lines 160 shown in FIGS. 6A and 6B include first touch line segment 162 and second touch line segment 164, which surround the blue (B) subpixel so as to define a line opening 166 for opening the blue (B) subpixel. Further, the touch lines 160 include line branch portions 168, which extend from the second touch line segment 164 onto the bank 128 between the red (R) subpixel and the green (G) subpixel. The line branch portions 168, as shown in FIG. 6A, may be disposed so as to face at least one of the electrode branch portions 158 or the dummy branch portions 198 in the horizontal direction, or, as shown in FIG. 6B, may be disposed alternately with at least one of the electrode branch portions 158 or the dummy branch portions 198 in the vertical direction. The line branch portion 168 is formed so as to have a length that is less than or equal to the length of the first touch line segment 162. The touch electrodes 150 shown in FIGS. 6A and 6B include first touch electrode segment 152 and second touch electrode segment 154, which define the first electrode opening 156a, the second electrode opening 156b, and the third electrode opening 156c, which respectively expose the red (R), blue (B) and green (G) subpixels. Further, the touch electrodes 150 include electrode branch portions 158, which extend from the second touch electrode segment 154 onto the bank 128 between the red (R) subpixel and the green (G) subpixel. The electrode branch portion 158 is formed so as to have a length that is less than or equal to the length of the first touch electrode segment 152. The dummy pattern 190 shown in FIGS. 6A and 6B includes first dummy pattern segment 192 and second dummy pattern segment 194, which surround the blue (B) subpixel so as to define a dummy opening 196 for exposing the blue (B) subpixel. Further, the dummy pattern 190 includes dummy branch portions 198, which extend from the second dummy pattern segment 194 onto the bank 128 between the red (R) subpixel and the green (G) subpixel. The dummy branch portion 198 is formed so as to have a length that is less than or equal to the length of the first dummy pattern segment 192.

Figure 6C:
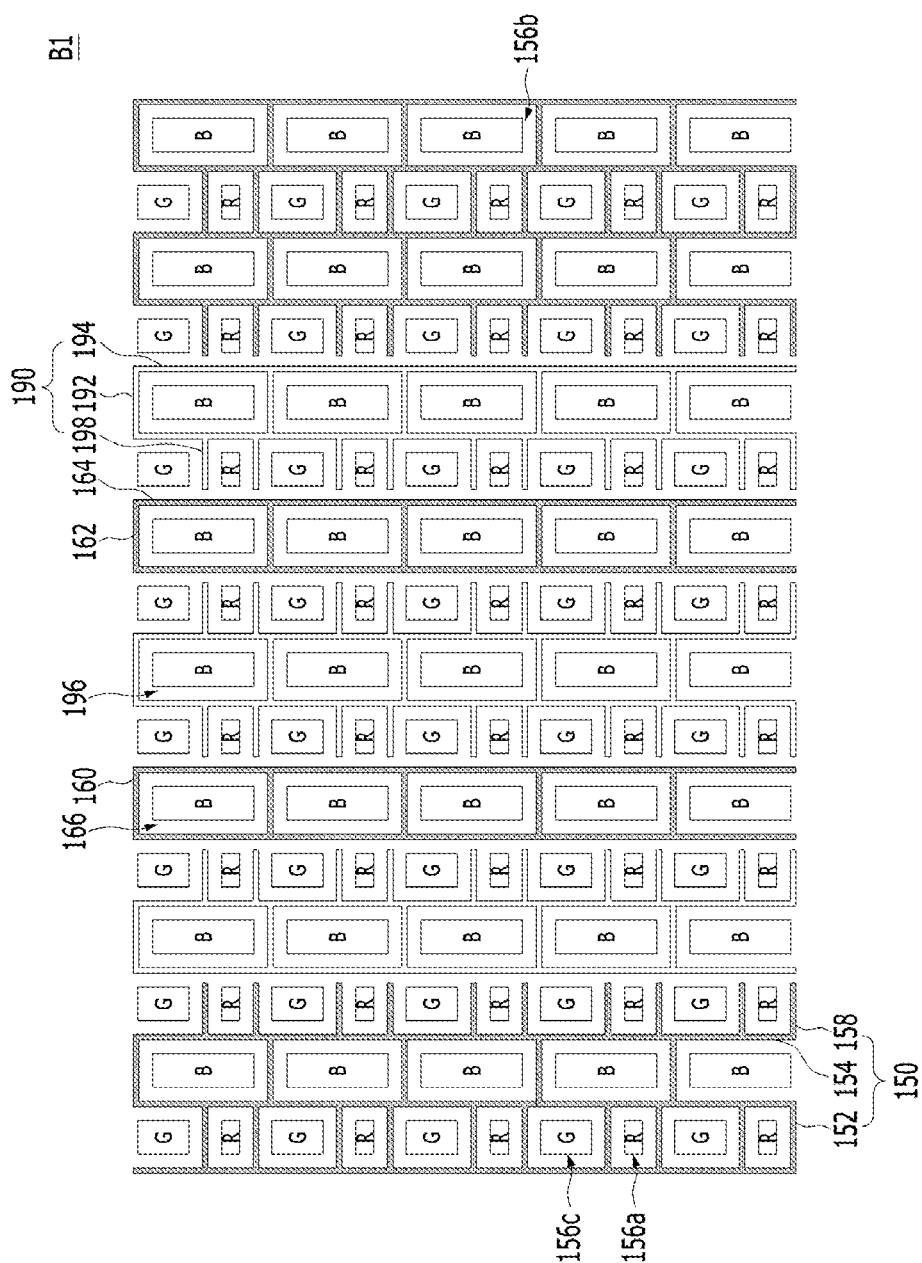

As shown in FIG. 6C, the touch electrodes 150 and the dummy pattern 190, except for the touch lines 160, respectively include electrode branch portions 158 and dummy branch portion 198. The touch lines 160 shown in FIG. 6C include first touch line segment 162 and second touch line segment 164, which surround the blue (B) subpixel so as to define a dummy opening 196 for exposing the blue (B) subpixel. However, the present disclosure is not limited thereto, the first touch line segment 162 and second touch line segment 164 of the touch lines 160 may also surround the red (R) subpixel and the green (G) subpixel so as to define line openings 166a and 166c for exposing the red (R) subpixel and the green (G) subpixel. The touch electrodes 150 include electrode branch portions 158, which extend from the second touch electrode segment 154 onto the bank 128 between the red (R) subpixel and the green (G) subpixel. The electrode branch portion 158 is formed so as to have a length that is less than or equal to the length of the first touch electrode segment 152. The dummy pattern 190 shown in FIG. 6C includes dummy branch portions 198, which extend from the second dummy pattern segment 194 onto the bank 128 between the red (R) subpixel and the green (G) subpixel. The dummy branch portion 198 is formed so as to have a length that is less than or equal to the length of the first dummy pattern segment 192.

Figure 6D:
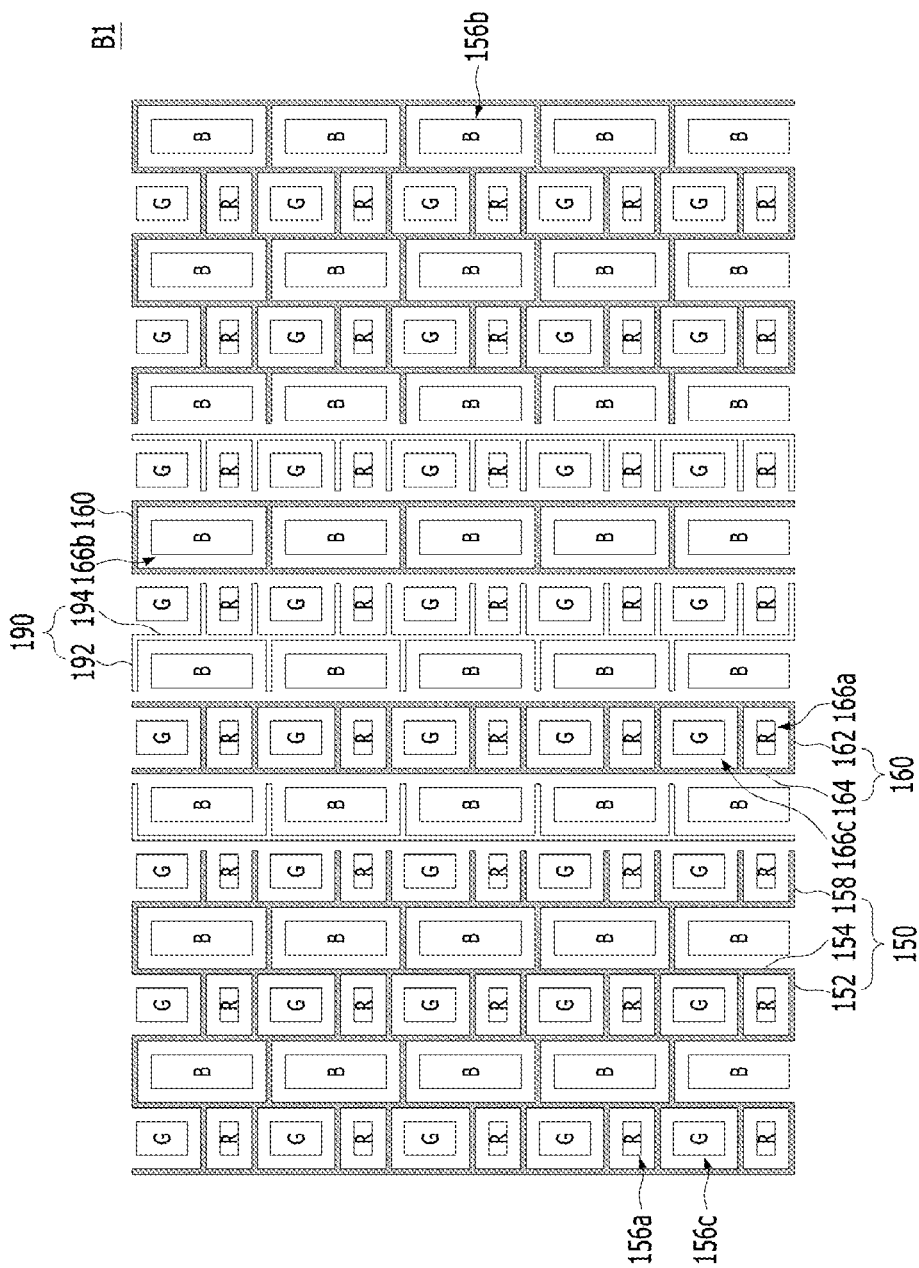

Referring to FIG. 6D, the touch electrodes 150, except for the touch lines 160 and the dummy pattern 190, include branch portions 158. The dummy pattern 190 shown in FIG. 6D is formed such that first dummy patterns are disposed at both sides of a second dummy pattern segment 194 so as not to define a dummy opening. In this case, the dummy pattern 190 has a line path that extends in one direction.

Figure 6E:
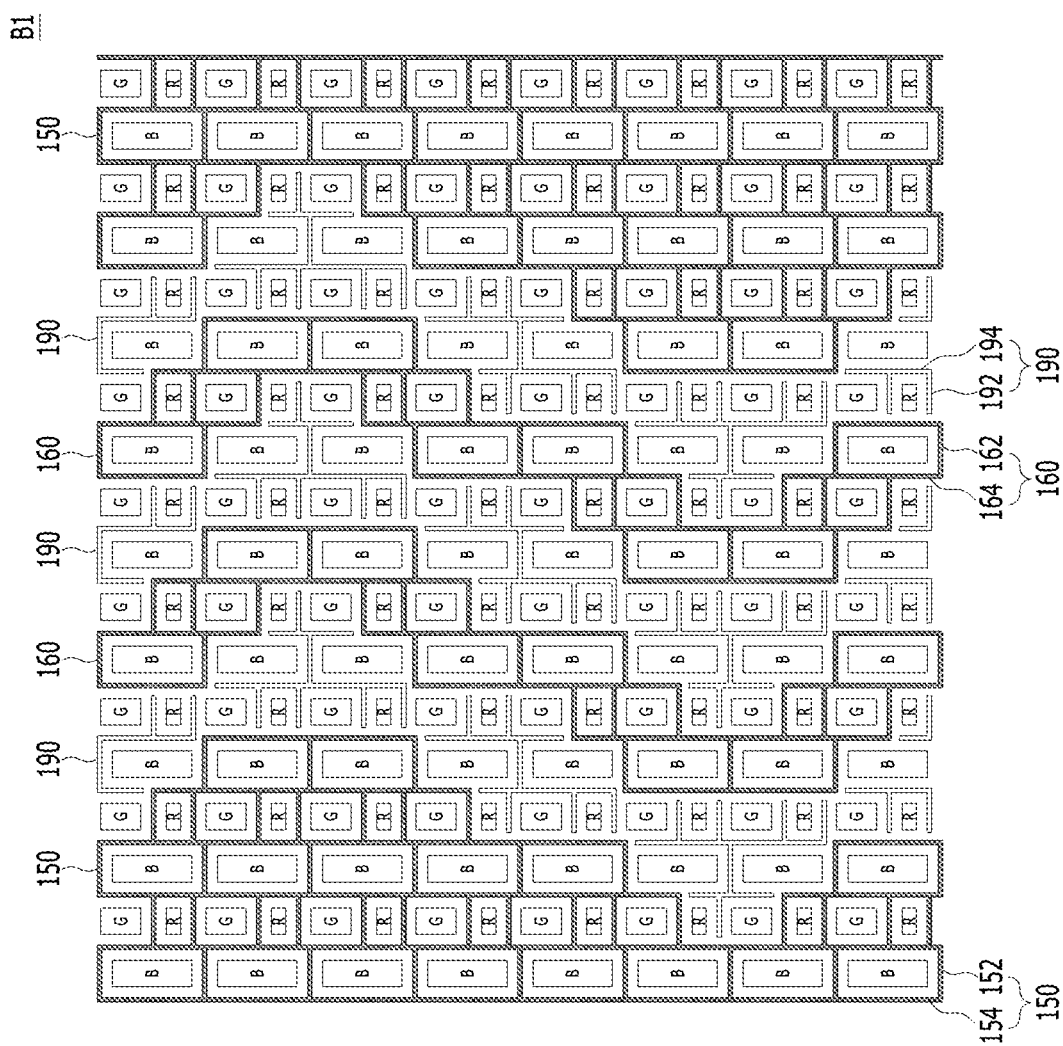

A configuration in which at least one of the touch lines 160 or the touch electrodes 150 has a straight-line shape of a mesh structure is illustrated in FIGS. 6A to 6D by way of example. Alternatively, as shown in FIG. 6E, at least one of the touch lines 160 or the touch electrodes 150 may have a stepped shape or a zigzag shape. Here, the dummy pattern 190 is maintained in a floating state. Thus, as shown in FIG. 6E, a plurality of dummy patterns may be independently formed, rather than being formed in a line shape.

Figure 7:
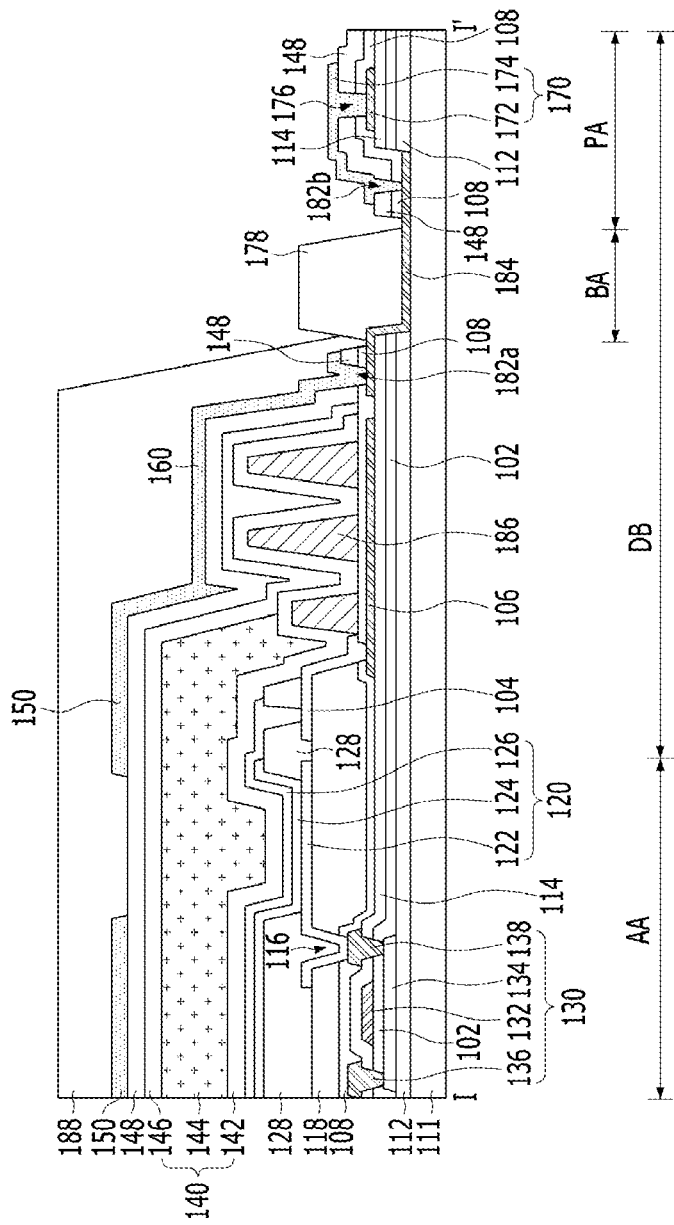
FIG. 7 is a cross-sectional view showing a light-emitting display device to which the touch electrodes are applied according to embodiments of the present disclosure.

FIG. 7 is a cross-sectional view showing a light-emitting display device to which the touch electrodes according to the embodiments of the present disclosure are applied. As shown in FIG. 7, the touch lines 160, the touch electrodes 150, and the dummy pattern 190 described above may be directly formed on light-emitting elements 120.

As shown in FIG. 7, the touch display device includes light-emitting diodes 120 arranged in a matrix form on a substrate 111, an encapsulation layer 140 disposed on the light-emitting elements 120, and touch electrodes 150 disposed on the encapsulation layer 140.

The substrate 111 may be formed of a flexible material such as plastic or glass so as to be foldable or bendable. For example, the substrate 111 is formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

A plurality of thin-film transistors 130, which are included in the pixel driving circuit, are disposed on the substrate. As shown in FIG. 7, each of the thin-film transistors 130 includes a semiconductor layer 134 disposed on a multi-buffer film 112, a gate electrode 132 overlapping the semiconductor layer 134 with a gate insulation film 102 interposed therebetween, and source and drain electrodes 136 and 138 formed on an interlayer insulation film 114 so as to come into contact with the semiconductor layer 134. Here, the semiconductor layer 134 is formed of at least one of an amorphous semiconductor material, a polycrystalline semiconductor material, or an oxide semiconductor material.

The light-emitting element 120 includes an anode 122, at least one light-emitting stack 124 formed on the anode 122, and a cathode 126 formed on the light-emitting stack 124.

The anode 122 is conductively connected to the drain electrode 138 of the thin-film transistor 130, which is exposed through a pixel contact hole 116 penetrating a protective film 108 and a pixel planarization layer 118.

At least one light-emitting stack 124 is formed on the anode 122 in an emission area that is defined by a bank 128. The light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or under the light-emitting stack 124, a color image may be realized. In addition, colored light corresponding to each subpixel may be generated in each light-emitting stack 124 in order to realize a color image without a separate color filter. That is, the light-emitting stack 124 of the red subpixel may generate red light, the light-emitting stack 124 of the green subpixel may generate green light, and the light-emitting stack 124 of the blue subpixel may generate blue light.

The cathode 126 is formed so as to face the anode 122 with the light-emitting stack 124 interposed therebetween, and is connected to first low-voltage supply line 106 and second low-voltage supply line 104. The first low-voltage supply line 106 is disposed in the same plane as the source and drain electrodes 136 and 138 and is formed of the same material as the source and drain electrodes 136 and 138. The second low-voltage supply line 104 is disposed in the same plane as the anode 122 and is formed of the same material as the anode 122.

The encapsulation layer 140 prevents external moisture or oxygen from permeating the light-emitting element 120, which is vulnerable to external moisture or oxygen. To this end, the encapsulation layer 140 includes at least one inorganic encapsulation layer 142 and at least one organic encapsulation layer 144. In the present disclosure, the structure of the encapsulation layer 140 in which the first inorganic encapsulation layer 142, the organic encapsulation layer 144 and the second inorganic encapsulation layer 146 are stacked in that order will be described by way of example, and the present disclosure is not limited thereto.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, so as to cover the upper surface, the lower surface and the side surface of the organic encapsulation layer 144 together with the first inorganic encapsulation layer 142.

The first inorganic encapsulation layer 142 and second inorganic encapsulation layer 146 minimize or prevent the permeation of external moisture or oxygen into the light-emitting stack 124. Each of the first inorganic encapsulation layer 142 and second inorganic encapsulation layer 146 is formed of an inorganic insulation material that is capable of being deposited at a low temperature, such as silicon nitride (SiNx), silicon oxide (SiOx), silicon oxide nitride (SiON), or aluminum oxide ($Al_2O_3$). Thus, since the first inorganic encapsulation layer 142 and second inorganic encapsulation layer 146 are deposited in a low-temperature atmosphere, it is possible to prevent damage to the light-emitting stack 124, which is vulnerable to a high-temperature atmosphere, during the process of depositing the first inorganic encapsulation layer 142 and second inorganic encapsulation layer 146.

The organic encapsulation layer 144 serves to dampen the stress between the respective layers due to bending of the organic light-emitting display device and to increase planarization performance. The organic encapsulation layer 144 is formed on the substrate 111, on which the first inorganic encapsulation layer 142 has been formed, using a non-photosensitive organic insulation material, such as PCL, acrylic resin, epoxy resin, polyimide, polyethylene or silicon oxycarbide (SiOC), or using a photosensitive organic insulation material such as photoacryl. The organic encapsulation layer 144 is disposed in the active area AA, rather than the non-active area. Here, at least one dam 186 is disposed on the protective film 108 in order to prevent the organic encapsulation layer 144 from diffusing to the non-active area NA. The dam 186 is formed of the same material as at least one of the planarization layer 108 or the bank 128. For example, in the case in which a plurality of dams 186 is provided, the dam 186 that is the closest to the active area AA is formed in a single-layer structure using the same material as any one of the planarization layer 108 and the bank 128, and the remaining ones of the dams 186 are formed in a multi-layer structure using the same materials as the planarization layer 108 and the bank 128. In this case, the dam 186 that is the closest to the active area AA has a lower height than the remaining dams 186. Therefore, the organic encapsulation layer 144 is disposed on the portion of the upper surface of the dam 186 that is the closest to the active area AA, thereby compensating for the difference in height between the dam 186 and each of the planarization layer 108 and the bank 128.

The touch electrode 150, the touch line 160, and the dummy pattern 190 are disposed in the active area AA of the encapsulation layer 140. In order to prevent an increase in the capacitance of the parasitic capacitor between the touch electrode 150 and the cathode 126, a touch buffer layer 148, which is implemented as an inorganic or organic insulation film, may be disposed between the encapsulation layer 140 and the touch electrode 150. In this case, the touch line is disposed along the side surface of the touch buffer layer 148.

The touch electrode 150, the touch line 160, and the dummy pattern 190 are disposed in the same plane in the active area AA and are formed of the same material. That is, the touch electrode 150, the touch line 160, and the dummy pattern 190 are disposed in a single-layer structure without an insulation film. Accordingly, the touch electrode 150, the touch line 160, and the dummy pattern 190 may be formed through a single mask process. Further, it is possible to reduce the thickness of the touch display device that includes the touch electrode 150, the touch line 160, and the dummy pattern 190.

Figure 8:
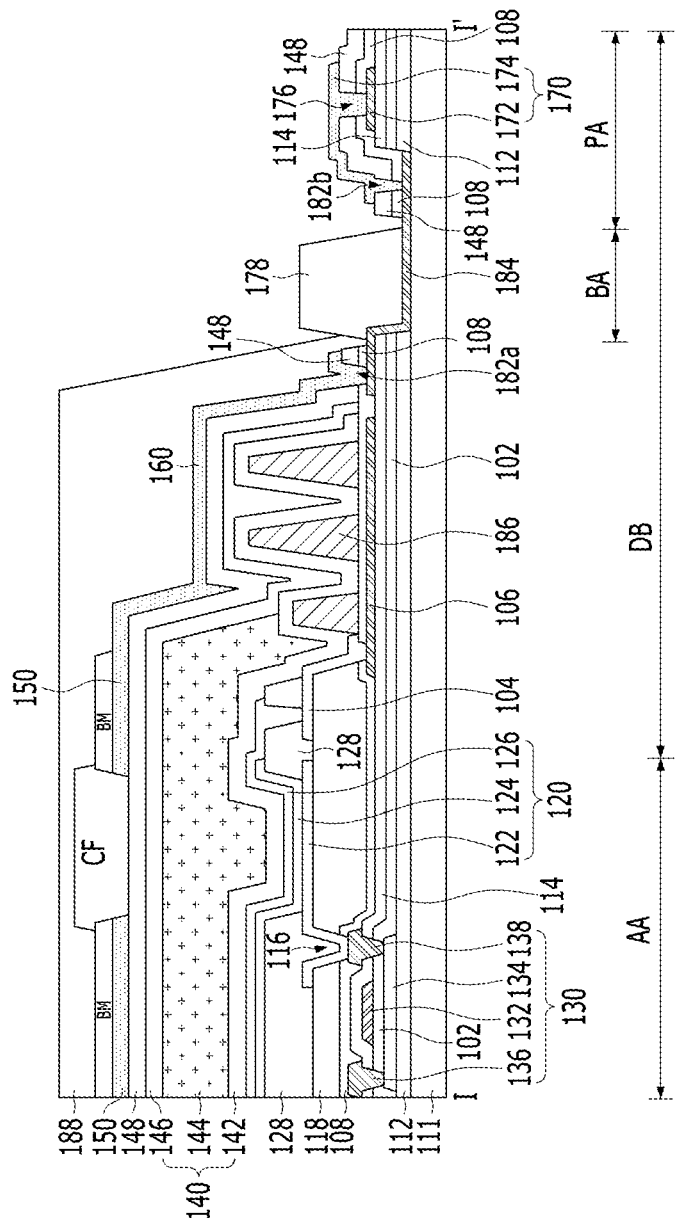
FIG. 8 is a cross-sectional view showing another example of a light-emitting display device to which the touch electrodes are applied according to embodiments of the present disclosure.

FIG. 8 is a cross-sectional view showing another example of a light-emitting display device to which the touch electrodes according to the embodiments of the present disclosure are applied. As shown in FIG. 8, black matrixes BM may be disposed on the touch electrode 150, the touch line 160, and the dummy pattern 190, and a color filter CF may be disposed between the black matrixes BM.

The black matrixes BM prevent the touch electrode 150, the touch line 160, and the dummy pattern 190 from being visible due to reflection of external light. The color filter CF prevents the cathode 126 from being visible due to reflection of external light. Further, the black matrixes BM and the color filter CF may be disposed between the touch electrode 150 and the encapsulation layer 140 in order to prevent an increase in the capacitance of the parasitic capacitor between the touch electrode 150 and the cathode 126.

The touch pad 170 connected to the touch line 160 is formed so as to be exposed by a touch protective film 188. Accordingly, the touch pad 170 is connected to a signal transmission film on which the touch-driving circuit (not shown) is mounted.

The touch pad 170 is disposed in a pad area PA of the lower bezel area DB. The touch pad 170 includes a lower touch pad electrode 172 and an upper touch pad electrode 174 that is in contact with the lower touch pad electrode 172. The lower touch pad electrode 172 is disposed in the same plane as at least one of the gate electrode 132 or the drain electrode 138 and is formed of the same material. For example, the lower touch pad electrode 172 is formed of the same material as the drain electrode 138, and is disposed in the same plane as the drain electrode 138, i.e. on the interlayer insulation film 114. The upper touch pad electrode 174 is disposed in the same plane as the touch electrode 150 and is formed of the same material. The upper touch pad electrode 174 is conductively connected to the lower touch pad electrode 172 exposed through a touch pad contact hole 176, which penetrates the protective film 108 and the touch buffer layer 148. The touch electrodes 150, touch lines 160 and upper touch pad electrode 174 and/or lower touch pad electrode 172 may be formed in a single-layer or multi-layer structure using the same material such as Ta, Ti, Cu, Mo, Al, or alloy thereof, such as Ti—Al—Ti, Mo—Al—Mo, or any other combination thereof.

A bending area BA for bending or folding the substrate 111 is disposed in the lower bezel area DB together with the touch pad 170. The bending area BA corresponds to the area that is bent in order to place the non-display area such as the touch pad 170 and the display pad 180 on the rear surface of the active area AA. Accordingly, the area occupied by the active area AA is maximized and the area corresponding to the non-active area is minimized on the entire screen of the display device.

A bending signal line 184 is disposed across the bending area BA, and a crack prevention layer 178 is disposed in the bending area BA so that the bending area BA is easily bent. The crack prevention layer 178 is formed of an organic insulation material having a higher strain rate and higher impact resistance than the inorganic insulation film. For example, since the crack prevention layer 178 is formed together with at least one of the planarization layer 118 or the bank 128, the crack prevention layer 178 is disposed in the same plane as at least one of the planarization layer 118 or the bank 128 and is formed of the same material. The crack prevention layer 178, which is formed of an organic insulation material, has a higher strain rate than the inorganic insulation material and thus alleviates bending stress caused by bending of the substrate 111. Accordingly, the crack prevention layer 178 is capable of preventing cracking of the bending area BA, thus preventing cracks from spreading to the active area AA. The inorganic insulation films, which have higher hardness than the organic insulation material and thus easily crack due to bending stress, are removed from the overlapping area between the inorganic insulation films and the crack prevention layer 178. For example, the inorganic encapsulation layer 142 and the touch buffer layer 148, which are disposed on the crack prevention layer 178, and the multi-buffer film 112, the gate insulation film 102, and the interlayer insulation film 114, which are disposed below the crack prevention layer 178, are removed.

The bending signal line 184 disposed in the bending area BA is formed of the same material as the source and drain electrodes 136 and 138, and conductively connects the touch line 160 to the upper touch pad electrode 174. That is, the bending signal line 184 is exposed by a first bending contact hole 182a that penetrates the protective film 108 and the touch buffer layer 148, and is conductively connected to the touch line 160. Further, the bending signal line 184 is exposed by a second bending contact hole 182b that penetrates the protective film 108 and the touch buffer layer 148, and is conductively connected to the upper touch pad electrode 174.

Figure 9A:
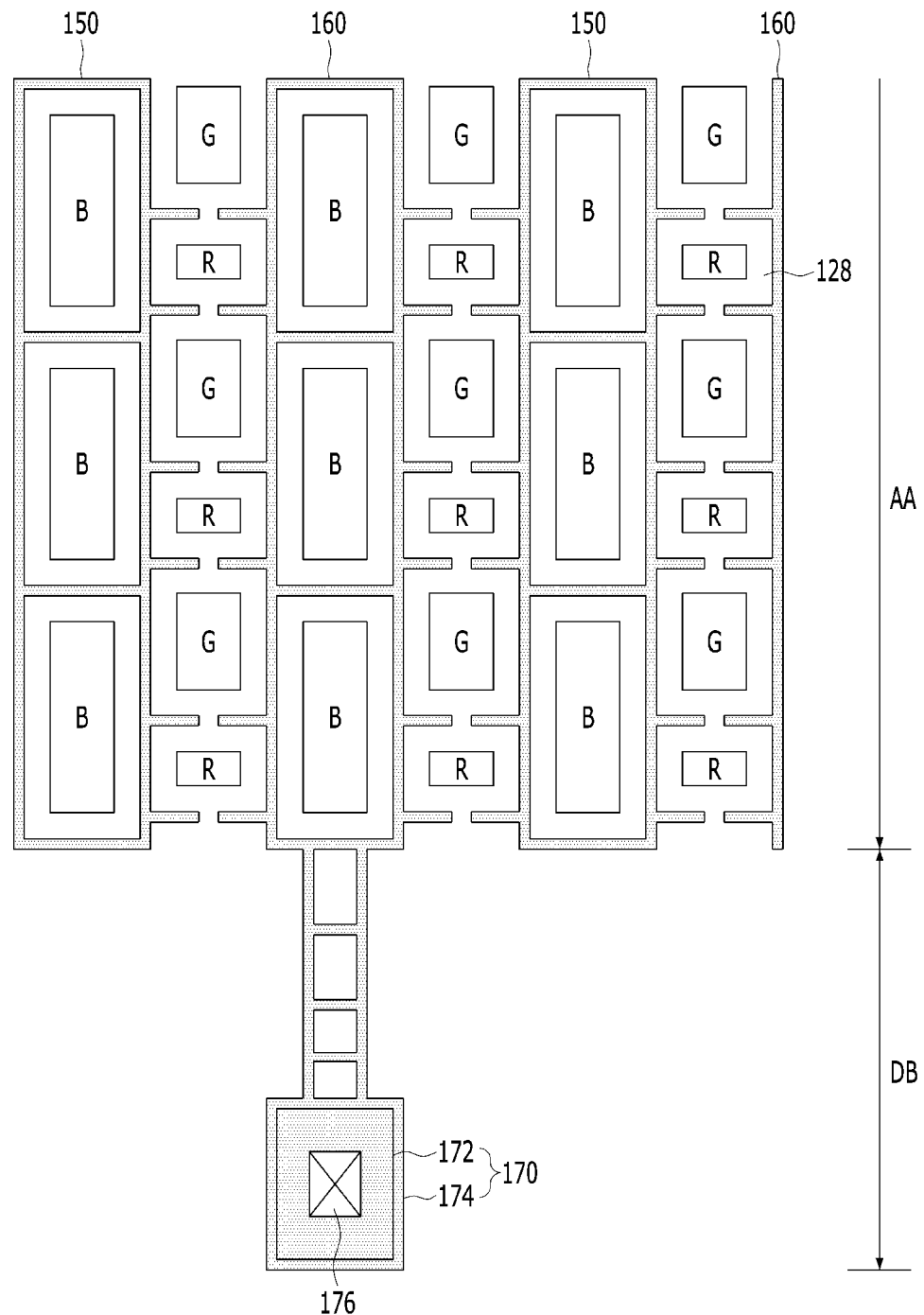
FIGS. 9A and 9B are plan views showing various examples of touch lines disposed in a lower bezel area according to the present disclosure.
Figure 9B:
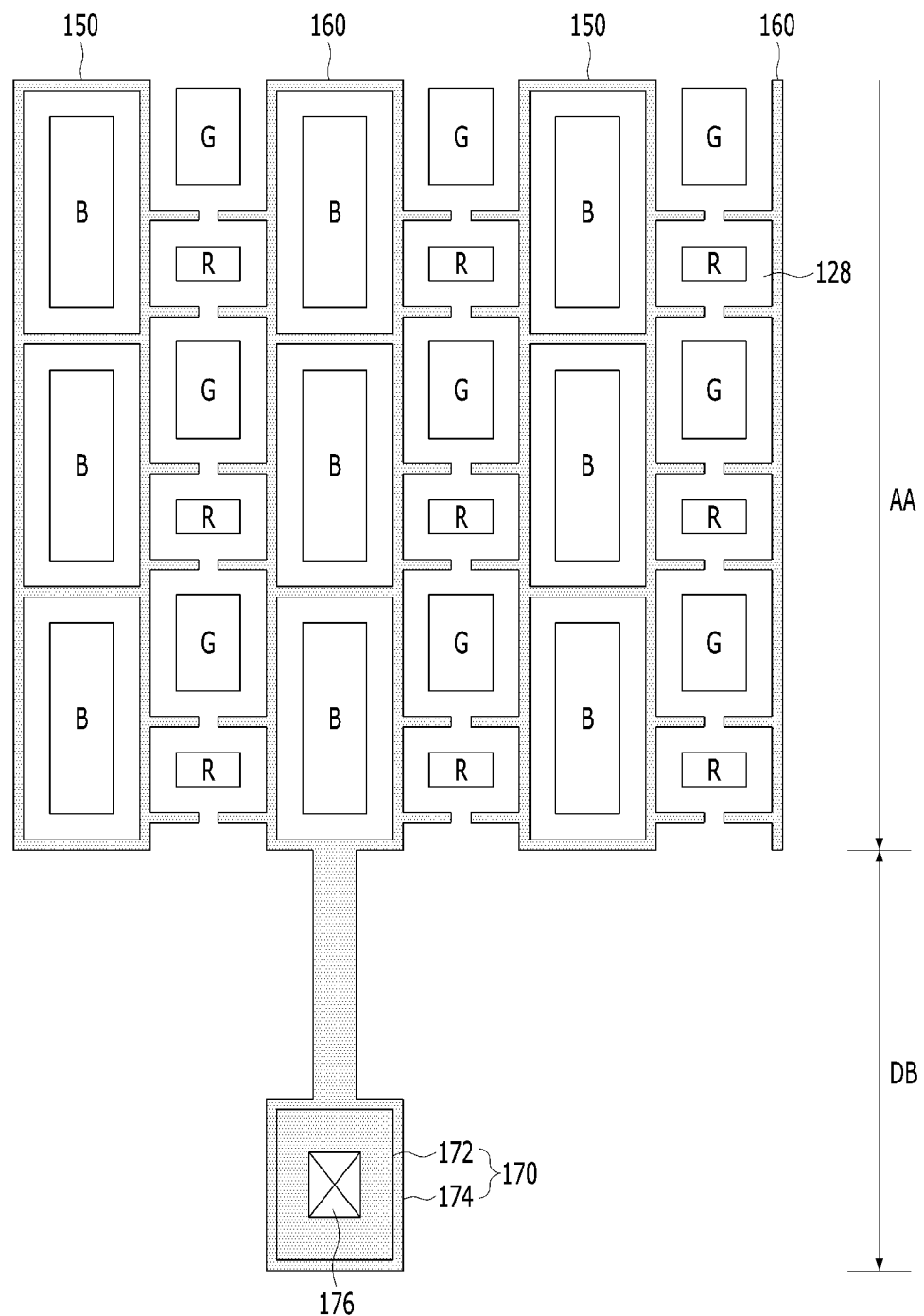

FIGS. 9A and 9B are plan views showing various examples of touch lines disposed in a lower bezel area according to the present disclosure. As shown in FIGS. 9A and 9B, the touch line 160 may extend to the touch pad 170, and may come into direct contact with the touch pad 170 without a bending signal line 184. The touch line 160 shown in FIG. 9A is formed in a mesh shape in the bezel area as well as the active area AA, and the touch line 160 shown in FIG. 9B is formed in a mesh shape only in the active area AA. In particular, the touch line 160 shown in FIG. 9A is formed in a mesh shape in the lower bezel area DB between the touch pads in the active area AA. In this case, since the touch line 160 has the first path P1 and the second path P2 in the lower bezel area DB, even when any one of the multiple paths of the touch line 160 is disconnected, transmission of a touch signal is enabled through the remaining path.

As is apparent from the above description, according to the present disclosure, some of touch lines are connected to a touch-driving circuit via an upper bezel, thus reducing the size of left and right bezel areas.

In addition, touch electrodes are formed so as to be the same size as each other, thus reducing noise due to variation in the area between the touch electrodes.

In addition, the touch electrodes and the touch lines are formed in a mesh shape, and a part of the touch electrodes and a part of the touch lines are formed in a zigzag shape or a stepped shape, thus preventing the touch electrodes and the touch lines from being visible.

In addition, a dummy pattern is provided between the touch electrodes, between the touch lines, and between the touch electrodes and the touch lines, thus preventing the boundary between the touch electrode and the touch line from being visible.

In addition, not more than two of the touch lines are disposed between each two touch electrodes of the touch electrodes, thus minimizing a dead zone.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device comprising:
   a substrate comprising an active area and a bezel area, the bezel area including a bending area and a pad area;
   light-emitting elements disposed in the active area;
   an encapsulation layer including at least one of an inorganic layer or an organic layer, disposed on the light-emitting elements;
   a plurality of touch electrodes in a mesh shape disposed on the encapsulation layer;
   a plurality of touch lines in the mesh shape disposed on the encapsulation layer and connected to respective ones of the plurality of touch electrodes, the plurality of touch lines having at least a first portion extending in a first direction and a second portion extending in a second direction different from the first direction in the active area; and
   a touch buffer layer disposed between the encapsulation layer and the plurality of touch electrodes, wherein the touch buffer layer covers a side surface of the encapsulation layer and extends to the pad area.

2. The display device according to claim 1, wherein the first direction is a vertical direction or a horizontal direction, and the second direction is a direction having an inclined angle with respect to the first direction.

3. The display device according to claim 1, wherein the plurality of touch lines are extended to a side surface of the encapsulation layer.

4. The display device according to claim 3, wherein the plurality of touch lines on the side surface of the encapsulation layer are in the mesh shape.

5. The display device according to claim 3, wherein the plurality of touch lines are further extended from the side surface of the encapsulation layer to the bending area and the pad area.

6. The display device according to claim 1, further comprising:
a touch pad disposed in the pad area; and
a bending signal line disposed in the bending area and connected to at least one of the plurality of touch lines and the touch pad.

7. The display device according to claim 6, further comprising:
a crack prevention layer on the bending signal line in the bending area.

8. The display device according to claim 6, further comprising:
at least one dam disposed between the active area and the bending area in the bezel area.

9. The display device according to claim 8, further comprising:
a first contact hole and a second contact hole formed in the touch buffer layer in the bezel area.

10. The display device according to claim 9, wherein the bending signal line is connected to the at least one touch line through the first contact hole adjacent to the at least one dam, and connected to the touch pad through the second contact hole adjacent to the pad area.

11. The display device according to claim 9, further comprising:
a third contact hole formed in the touch buffer layer in the pad area.

12. The display device according to claim 11, wherein the touch pad includes an upper touch pad electrode and a lower touch pad electrode connected through the third contact hole in the pad area.

13. The display device according to claim 7, further comprising:
a touch protective layer disposed on the plurality of touch electrodes in the active area.

14. The display device according to claim 13, wherein the touch protective layer extends to the bending area and is disposed on at least a part of the crack prevention layer in the bending area.

15. The display device according to claim 14, wherein the crack prevention layer and the touch protective layer are made of an organic material.

16. The display device according to claim 8, wherein each of the light-emitting elements includes an anode, at least one light-emitting stack, and a cathode.

17. The display device according to claim 16, further comprising:
a first low-voltage supply line disposed under the at least one dam.

18. The display device according to claim 17, further comprising:
a second low-voltage supply line connecting the first low-voltage supply line and the cathode.

19. The display device according to claim 6, further comprising:
a display pad disposed adjacent to the touch pad in the pad area.

20. The display device according to claim 19, wherein the touch pad is formed in a same stacking structure in the same plane as the display pad.

21. The display device according to claim 1, further comprising:
a bank disposed between the light-emitting elements.

22. The display device according to claim 21, wherein at least one of the plurality of touch electrodes and at least one of the plurality of touch lines corresponds to the bank in the active area.

23. The display device according to claim 21, wherein each of the plurality of touch lines comprises a first touch line segment and a second touch line segment defining a plurality of openings to expose emission areas of the light-emitting elements, and
wherein the first touch line segment and the second touch line segment overlap the bank and are formed in the mesh shape.

24. The display device according to claim 1, wherein a part of the plurality of touch electrodes and a part of the plurality of touch lines are formed in a zigzag shape or a stepped shape.

25. The display device according to claim 1, further comprising:
a dummy pattern disposed between the plurality of touch electrodes, between the plurality of touch lines, and between the plurality of touch electrodes and the plurality of touch lines.

26. The display device according to claim 25, wherein the dummy pattern is in a floating state in which no driving signal or voltage is applied.

27. The display device according to claim 25, wherein the dummy pattern is spaced apart from the plurality of touch electrodes and the plurality of touch lines.

28. The display device according to claim 25, wherein the plurality of touch electrodes, the plurality of touch lines, and the dummy pattern are formed of a same material and are disposed in a same plane in the active area.

29. The display device according to claim 25, further comprising:
a bank disposed between the light-emitting elements,
wherein the dummy pattern overlaps the bank and is formed in a mesh shape.

30. The display device according to claim 1, wherein the plurality of touch lines are disposed along a side surface of the touch buffer layer.

31. The display device according to claim 1, further comprising:
black matrixes disposed on the plurality of touch electrodes; and
a color filter disposed between the black matrixes.

* * * * *